(12) United States Patent
Meier

(10) Patent No.: US 12,317,454 B2
(45) Date of Patent: May 27, 2025

(54) METHOD FOR CONTROLLING THE TEMPERATURE OF A SWITCHGEAR CABINET FOR MEDIUM-VOLTAGE AND HIGH-VOLTAGE SWITCHING DEVICES

(71) Applicant: Siemens Energy Global GmbH & Co. KG, Munich (DE)

(72) Inventor: Thomas Meier, Berlin (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 378 days.

(21) Appl. No.: 17/642,828

(22) PCT Filed: Aug. 26, 2020

(86) PCT No.: PCT/EP2020/073798
§ 371 (c)(1),
(2) Date: Mar. 14, 2022

(87) PCT Pub. No.: WO2021/047907
PCT Pub. Date: Mar. 18, 2021

(65) Prior Publication Data
US 2022/0386511 A1    Dec. 1, 2022

(30) Foreign Application Priority Data

Sep. 12, 2019    (DE) .................... 10 2019 213 912.4

(51) Int. Cl.
*H05K 7/20* (2006.01)

(52) U.S. Cl.
CPC ............................... *H05K 7/20709* (2013.01)

(58) Field of Classification Search
CPC ...... H02B 1/565; H05K 7/20709; H05K 1/00; H05K 3/00; H05K 5/00; H05K 7/00; H05K 9/00; H05K 10/00; H05K 11/00; H05K 13/00; H05K 2201/00
See application file for complete search history.

(56) References Cited

U.S. PATENT DOCUMENTS

| | | | |
|---|---|---|---|
| 5,934,368 A | 8/1999 | Tanaka et al. | |
| 6,041,851 A | 3/2000 | Diebel et al. | |
| 2005/0268627 A1* | 12/2005 | Vogh, III | ............... F25D 21/04 |
| | | | 62/176.6 |
| 2009/0206714 A1* | 8/2009 | Henke | ...................... H02B 1/38 |
| | | | 312/223.6 |
| 2013/0046398 A1* | 2/2013 | Hain | ................... G05B 19/042 |
| | | | 700/90 |
| 2018/0059695 A1 | 3/2018 | Carignan | |

FOREIGN PATENT DOCUMENTS

| | | |
|---|---|---|
| CA | 2764790 A1 | 7/2012 |
| DE | 2534909 A1 | 2/1977 |
| DE | 102014105051 A1 | 10/2014 |
| KR | 20190011967 A | 2/2019 |

* cited by examiner

*Primary Examiner* — Kidest Bahta
(74) *Attorney, Agent, or Firm* — Laurence A. Greenberg; Werner H. Stemer; Ralph E. Locher

(57) ABSTRACT

A method for controlling the temperature of a switchgear cabinet for medium- or high-voltage switching devices. The switchgear cabinet is heated with anti-condensation heating to prevent a condensation of air moisture on components that are located in the inner volume of the switchgear cabinet. The method is particularly environmentally friendly and sustainable. There is also described a system for carrying out such a method.

14 Claims, 5 Drawing Sheets

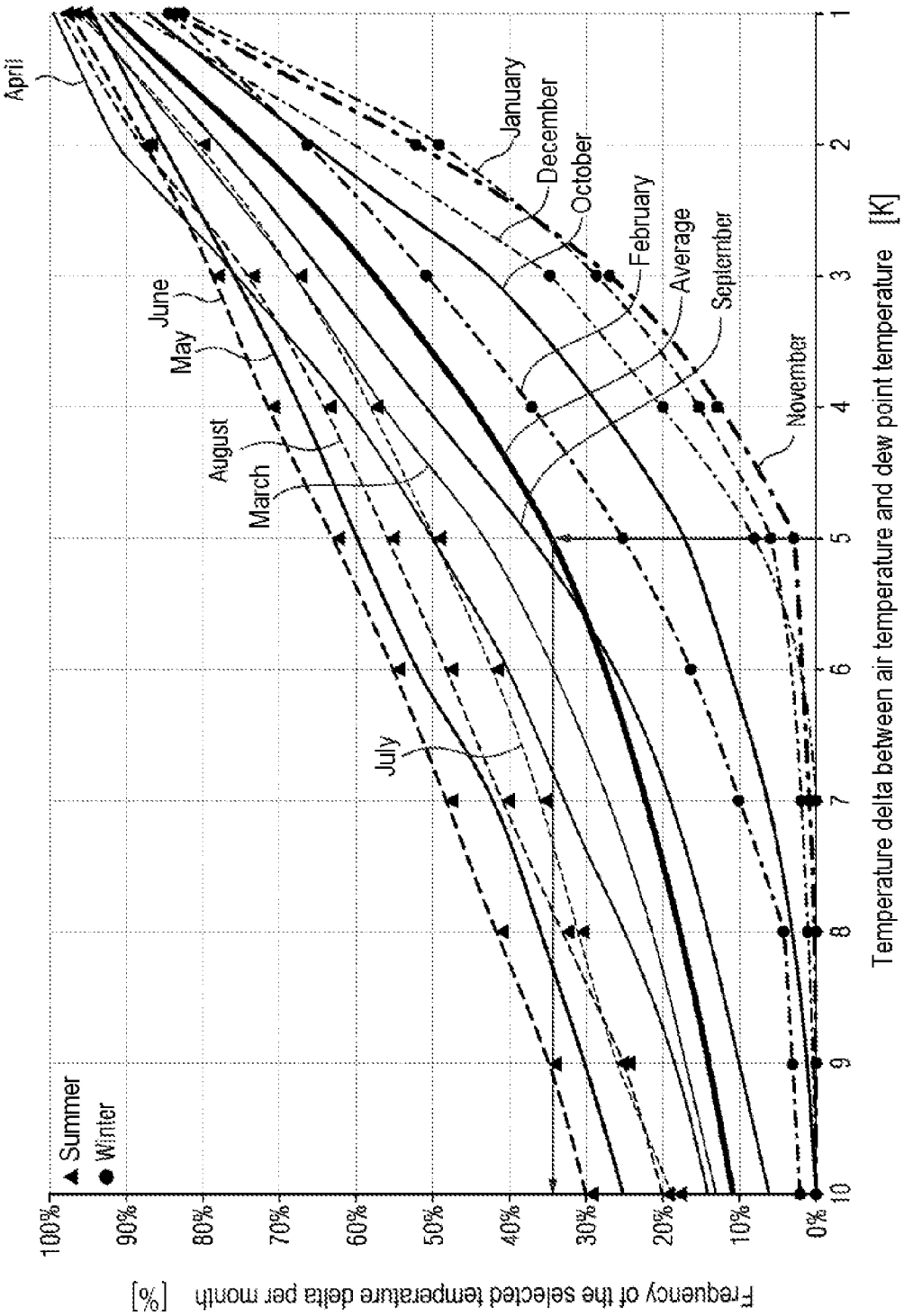

METHOD FOR CONTROLLING THE TEMPERATURE OF A SWITCHGEAR CABINET FOR MEDIUM-VOLTAGE AND HIGH-VOLTAGE SWITCHING DEVICES

FIELD AND BACKGROUND OF THE INVENTION

The present invention relates to a method for controlling the temperature of a switchgear cabinet for medium-voltage and high-voltage switching devices, wherein the method is particularly energy-efficient. The present invention also relates to a system for controlling the temperature of a switchgear cabinet for medium-voltage and high-voltage switching devices, which system permits such a method.

Switchgear installations for isolating currents are widely known. The arrangement of switching modules in medium-voltage and high-voltage switchgear installations, for example, can be carried out in very different ways. It is known that such switchgear installations are assigned switchgear cabinets which are used to control the switchgear installations.

Condensation on components can occur under specific climatic conditions in the switchgear cabinets of high-voltage and medium-voltage switching devices, for instance circuit breakers and isolating switches. Over a relatively long period, condensation may result in corrosion of critical components. Anti-condensation heating systems, which are operated continuously and, as far as possible, non-selectively, are used in the switchgear cabinets to prevent condensation.

However, such solutions which are known from the prior art can provide yet further potential for improvement, in particular with regard to improved condensation protection.

SUMMARY OF THE INVENTION

The object of the present invention is to at least partially overcome the disadvantages known from the prior art. In particular, the object of the present invention is to provide a solution which can be used to improve a means for preventing the condensation on a component in a switchgear cabinet for a switchgear installation.

The object is achieved, according to the invention, at least partially by means of a method having the features as claimed. The object is also achieved, according to the invention, by means of a system having the features as claimed. Preferred configurations of the invention are described in the dependent claims, in the description or the figures, wherein further features which are described or shown in the subclaims or in the description or the figures can constitute, individually or in any desired combination, a subject of the invention if the opposite is not clear from the context.

A description is given of a method for controlling the temperature of a first switchgear cabinet for medium-voltage or high-voltage switching devices, wherein the first switchgear cabinet comprises an anti-condensation heating system for preventing condensation of air humidity on components in the internal volume of the first switchgear cabinet, wherein the method has at least the following method steps of:
  a) determining the humidity of the atmosphere in the internal volume of the first switchgear cabinet;
  b) determining the temperature of the atmosphere in the internal volume of the first switchgear cabinet;
  c) determining the dew point temperature of the atmosphere in the internal volume of the first switchgear cabinet on the basis of the humidity and the temperature of the atmosphere in the internal volume of the first switchgear cabinet;
  d) determining the component temperature of at least one component in the internal volume of the first switchgear cabinet; and
  e) creating a control command for controlling the anti-condensation heating system on the basis of a comparison of the component temperature determined in method step d) and the dew point temperature determined in method step c).

Such a method allows switchgear cabinets to be heated in an easily implementable and efficient manner in order to prevent or at least reduce the condensation of air humidity on components inside the switchgear cabinet.

The described method is therefore used to control the temperature of a first switchgear cabinet, wherein the switchgear cabinet is assigned to a medium-voltage switching device or a medium-voltage switchgear installation or to a high-voltage switching device or a high-voltage switchgear installation. Such switching devices or switchgear installations are known per se and comprise circuit breakers and/or isolating switches, for example. They are generally installations in which electrical energy is distributed or transformed. Within the sense of the invention, a medium-voltage switching device should also be understood as meaning, in particular, a device in which voltages, which are approximately in a range of 1 kV to approximately 60 kV, are switched or isolated. Furthermore, a high-voltage switching device should be understood as meaning a device in which voltages, which are in a range of more than approximately 60 kV to 1000 kV or even more, for example up to 1150 kV, are switched or isolated.

Auxiliary contacts which reflect the status of the main contacts of the switchgear installations are usually provided in the switchgear cabinet(s) of such switchgear installations. However, control electronics for the switchgear installation may fundamentally be provided in the switchgear cabinet.

On account of climatic conditions, it may be possible for dew or condensed air humidity to occur on components inside the switchgear cabinet. This may result in corrosion of components inside the switchgear cabinet. In order to prevent this, a so-called anti-condensation heating system is generally provided. The latter may heat up the atmosphere or the components inside the switchgear cabinet and can thereby prevent condensation of the air humidity. Accordingly, provision is made for the switchgear cabinet to comprise an anti-condensation heating system for preventing condensation of air humidity on components in the internal volume of the first switchgear cabinet.

In order to make it possible to control the anti-condensation heating system in an improved manner in the switchgear cabinet, the method described here has at least the following method steps.

According to method step a), the humidity of the atmosphere in the internal volume of the first switchgear cabinet, that is to say in particular the air humidity of the air in the switchgear cabinet, is determined. According to this method step, the air humidity present in the atmosphere, that is to say in particular in the air, inside the switchgear cabinet and therefore in particular inside a housing of the switchgear cabinet is therefore detected, for example using an appropriate sensor.

This step can be implemented, for instance, using one or more conventional sensors for determining the air humidity arranged inside or outside the switchgear cabinet.

According to method step b), the temperature of the atmosphere in the internal volume of the first switchgear cabinet, that is to say in other words the air temperature of the air in the switchgear cabinet, is determined. According to this method step, the temperature present in the atmosphere or in the air inside the switchgear cabinet and therefore in particular inside a housing of the switchgear cabinet is therefore detected, for example using an appropriate sensor or thermometer.

This step can be implemented, for instance, using one or more conventional sensors for determining the temperature arranged inside or outside the switchgear cabinet.

According to the further method step c), the method comprises the step of determining the dew point temperature of the atmosphere, for instance the air, in the internal volume of the first switchgear cabinet on the basis of the humidity and the temperature of the atmosphere in the internal volume of the first switchgear cabinet.

This step is therefore based on the fact that it is possible to determine the dew point temperature, for instance solely by means of the previously determined parameters, specifically the humidity and the temperature of the atmosphere or of the air inside the switchgear cabinet.

This is possible, for instance, by simply assigning corresponding values for the dew point temperature to the corresponding parameter pair comprising the temperature and humidity. This may therefore be possible by providing predefined values of the dew point temperature for a given humidity and temperature of the atmosphere or of the air or by means of an approximate calculation using the determined measured values, for instance using an approximation formula. Since switchgear cabinets are usually not pressure-tight, atmospheric pressure may be assumed for the pressure.

In this case, the dew point temperature should be understood as meaning, in a manner known per se, the temperature of the air which must be undershot for a constant pressure so that water vapor can be deposited as dew or mist or, in other words, the fact that air humidity can condense on components inside the switchgear cabinet if the component temperature undershoots the dew point temperature. At the dew point temperature, the relative air humidity is 100% and the air is currently saturated with water vapor.

According to the further method step d), the method also comprises determining the component temperature of at least one component in the internal volume of the first switchgear cabinet. This can be implemented, for example, using one sensor or a plurality of sensors, wherein a plurality of sensors may also be provided on different components, for instance on different components with a different mass.

This step can again be implemented, for example, using one or more conventional sensors for determining the temperature, in particular thermometers, arranged inside or outside the switchgear cabinet. The component(s) whose component temperature is determined may be, for example, those components in which condensation of air humidity is particularly critical, in particular with regard to corrosion. Components which have exposed corrosion-sensitive points are therefore important here, in particular.

Provision may therefore be made for at least one, for example all, of method steps a), b) and d) to be carried out with sensors arranged in the internal volume of the switchgear cabinet.

In addition or as an alternative to determining the humidity of the atmosphere in the internal volume of the first switchgear cabinet, determining the temperature of the atmosphere in the internal volume of the first switchgear cabinet and determining the component temperature of at least one component in the internal volume of the first switchgear cabinet using respective specific sensors, for instance inside the switchgear cabinet, these parameters may also be determined by means of an approximation or estimation. The assumption can therefore be made that the temperature of the atmosphere inside the switchgear cabinet and the component temperature are approximately equal to the temperature of the air surrounding the switchgear cabinet since the switchgear cabinets are usually not air-tight or are not completely thermally insulated with respect to the outside. The humidity of the atmosphere in the switchgear cabinet can likewise be inferred from the air humidity of the air surrounding the switchgear cabinet. Method steps a), b) and d) can therefore also be implemented by capturing weather data comprising the temperature and relative air humidity.

Exemplary critical components whose corrosion can be prevented comprise, without implying any kind of limitation, electrical contacts in auxiliary switches, $SF_6$ density monitors, oil pressure switches, relays or contactors. Alternative critical components are also those in which corrosion is not necessarily problematic, but rather it is important to prevent the bridging of isolation gaps. Accordingly, further critical components may be connectors or strips which could become conductive as a result of condensation.

According to method step e), the method also comprises creating and, in particular, executing a control command for controlling the anti-condensation heating system on the basis of a comparison of the component temperature determined in method step d) and the dew point temperature determined in method step c).

In the method described here, the anti-condensation heating system is therefore controlled on the basis of a combination of the parameters comprising the component temperature, atmospheric temperature inside the switchgear cabinet and humidity of the atmosphere inside the switchgear cabinet and therefore, in particular, the dew point temperature.

In particular, such control of the anti-condensation heating system may enable significant advantages over the solutions from the prior art for switchgear cabinets for high-voltage and medium-voltage switchgear installations.

This is because, according to the prior art, provision is often made in such switchgear cabinets for the anti-condensation heating systems to operate permanently, in particular, irrespective of the actual climatic conditions and therefore irrespective of the dew point temperature during continuous operation. In this respect, controlled heating systems can be used in medium-voltage applications, for example, but operate only with physical variables of the switchgear cabinet interior air, such as the temperature or the air humidity. However, these variables alone do not fully cover the problem of condensation on the critical components.

The anti-condensation heating system can be controlled with improved efficiency only as a result of the fact that, in addition to the physical variables of the internal atmosphere of the switchgear cabinet, the actual or approximated component temperatures are also determined in the method described here and are used for control together with the dew point temperature.

The method may therefore be based on the fact that, if the component temperature is greater than the dew point temperature, condensation will not take place or, in other words, condensation takes place when the component temperature is below the dew point temperature.

This is because the determination of the above-described parameters reliably makes it possible to determine both the dew point temperature and, as a result, a condition for which condensation of the air humidity takes place, and whether this condition is also actually present in one or more components. Accordingly, it is possible to estimate or determine, under real conditions, whether condensation on the component will take place and therefore whether there is a risk to the component as a result of corrosion which occurs and therefore whether heating is useful or whether condensation is unlikely or will not occur on account of the climatic conditions prevailing in the switchgear cabinet, with the result that it is possible to dispense with heating. The method described here therefore allows heating of the anti-condensation heating system of the switchgear cabinet as required, thus making it possible to dispense with permanent operation of the anti-condensation heating system.

This makes it possible to achieve the situation in which the anti-condensation heating systems operate with a lower energy consumption and, as a result, cause a significantly reduced load for the environment. For example, the carbon dioxide load for the environment can be significantly reduced in comparison with solutions having permanently operating anti-condensation heating systems.

In addition, the method described here can make it possible for the operational safety of the switchgear cabinet to be improved. This is because the risk of a fault state, which may also be critical to safety, is considerably increased during permanent operation of the anti-condensation heating system in comparison with the method described here.

The reliability of the anti-condensation heating system can also be improved for the same reasons, which allows service intervals to become less critical and can also reduce downtimes.

Preventing condensation of air humidity on components inside the switchgear cabinet also prevents or at least considerably reduces their corrosion. Safe and, in particular, energy-efficient control is achieved by controlling the anti-condensation heating systems in a manner adapted to the actual physical requirement. This control is based on climate/physically relevant state variables of the switchgear cabinet interior atmosphere or the switchgear cabinet interior air and of the critical components which only together exactly describe the conditions for possible condensation.

In this case, it is considered, in particular, that condensation can occur only under certain climatic conditions which are best described in the most reliable manner by the dew point temperature. In the method described here, the physical variable of the dew point is used to create a control variable, as a parameter in the comparison, together with temperatures of critical components in the interior of the switchgear cabinets, which control variable makes it possible to control the anti-condensation heating systems in a safe and energy-efficient manner.

Following the statements made above, the safe and in particular needs-based use of the anti-condensation heating system therefore results globally in a very great potential to save energy, to save costs and to reduce the emission of $CO_2$. This makes it possible to achieve a considerably improved $CO_2$ footprint of the switching devices.

Provision may preferably made for the output of the anti-condensation heating system to be reduced on the basis of the control command if the component temperature determined in method step d) is greater than the dew point temperature determined in method step c). For example, provision may be made for the anti-condensation heating system to be switched off on the basis of the control command if the component temperature determined in method step d) is greater than the dew point temperature determined in method step c).

In this configuration, provision is therefore made, in other words, for the anti-condensation heating system to operate in a basic state and to therefore heat the components inside the switchgear cabinet and for the heat output to be reduced, for instance for the heating system to be entirely switched off, only when this is indicated by the control command. This configuration allows the method described here to be carried out in a particularly effective and safe manner. This is because the heat output can be reduced all the way to the heating system being switched off, whenever this is indicated or permissible, which can considerably reduce the energy consumption, as described above. In addition, it is ensured that the anti-condensation heating system operates, for instance in the event of a fault in a control unit or in the absence of control commands, and condensation of air humidity and consequently the corrosion of components inside the switchgear cabinet is thus prevented.

It may also be preferred for the output of the anti-condensation heating system to be reduced on the basis of the control command if the component temperature determined in method step d) is greater than the dew point temperature determined in method step c), wherein a safety parameter is taken into account when comparing the component temperature determined in method step d) and the dew point temperature determined in method step c).

Therefore, as described above, a basic state of the anti-condensation heating system, in which the latter is active and wherein the heat output is reduced, for example the heating system is switched off, on the basis of a control command, is provided in this configuration. In this case, however, a safety parameter is taken into account when comparing the dew point temperature and the component temperature. In other words, provision is made for the control command for reducing the heat output of the anti-condensation heating system to be output when the component temperature, minus the safety parameter, is still greater than the dew point temperature. In other words, there must be a safety parameter as a particular temperature range between the dew point temperature and the component temperature in this configuration in order to output the control command and control the anti-condensation heating system. The safety parameter may be, for example, a factor or a defined temperature range.

This configuration makes it possible for the heat output to be reduced only when this can also be enabled in a particularly safe manner. This makes it possible to ensure, in a particularly effective manner, that corrosion of the components in the switchgear cabinet or, for instance, the deterioration of an isolation gap is prevented since it can be prevented or it is possible to at least considerably reduce the risk of the heat output being reduced even though this would not be indicated on the basis of the climate prevailing in the switchgear cabinet.

The safety parameter may be advantageous, for example, when the corresponding parameters are not explicitly measured, but rather are estimated or approximated, for example using weather data, as described above.

With respect to the safety parameter, provision may be made for the latter to be based on at least one of the type and the design of the component whose component temperature has been determined. In particular, these parameters may influence the temperature. This is because the type of component, that is to say what component or what type of component is involved, may indicate, for example, the material, size and criticality of corrosion or other influence caused by condensation. In particular, there may be an indication that a faulty state requires cost-intensive replacement or causes a safety-critical state. The design of the component, that is to say for instance how or from what materials the component is produced or formed, may also indicate the material and the size of the component for the specific configuration of a particular type of component. In this case, the material and the size may influence the thermal capacity and may therefore indicate the temperature of the component, for instance after a temperature change. These parameters may also indicate the susceptibility to corrosion.

The safety parameters can therefore be selected to be particularly large when corrosion of the component is likely in the case of condensation and would have serious consequences.

It may also be preferred for method step d) to comprise determining the component temperature of at least two components in the internal volume of the switchgear cabinet, and, in method step e), for the control command to be effected on the basis of a comparison of all determined component temperatures and the dew point temperature. In this configuration, provision may therefore be made for redundancy with respect to the component temperature to be enabled and/or for the different behavior with regard to the temperature to be considered for different components. This makes it possible to further prevent the risk of erroneous control. This is because it can now be allowed for the control command to be output only when the corresponding condition, for instance a higher component temperature in comparison with the dew point temperature, applies to both components.

In addition, it is also possible to take into account different components with different safety factors, for instance, which enables improved adaptivity and, as a result, takes into account a different susceptibility of the component materials to corrosion. This configuration may be advantageously implemented using appropriate sensors in the interior of the switchgear cabinet.

It may also be preferred for the control command to be used only to control the anti-condensation heating system of the first switchgear cabinet. In this configuration, the temperature of the anti-condensation heating system is therefore controlled for each of the switchgear cabinets in an autonomous manner. This configuration allows the method to be carried out with a particularly high degree of accuracy. This is because it becomes possible for the control of the anti-condensation heating system to be based on the conditions immediately prevailing in the switchgear cabinet.

This configuration can therefore be carried out in a particularly preferred manner if a control command is created by a local control unit assigned only to the first switchgear cabinet. The control unit may be arranged in the switchgear cabinet, for example. This configuration may also be in turn advantageously carried out using appropriate sensors in the interior of the switchgear cabinet.

However, it may likewise be possible for the control command to be used to control the anti-condensation heating system of the first switchgear cabinet and additionally to control an anti-condensation heating system of at least one second switchgear cabinet. In this configuration, the sensors for controlling a plurality of condensation heating systems can therefore be considerably reduced, for instance, since a plurality of anti-condensation heating systems can be controlled on the basis of a reduced number of measurements or estimations or approximations. This may be based, for example, on the fact that it can be assumed that the climatic conditions of adjacently arranged switchgear cabinets will be similar. Under this assumption, the created control command can be usable for other switchgear cabinets.

Accordingly, provision may be made for the component temperature determined for the first switchgear cabinet and the dew point temperature determined for the first switchgear cabinet to be used to create a control command for controlling the anti-condensation heating system of the second switchgear cabinet.

It may also be preferred for a control command to be created by a central control unit which receives data for a plurality of switchgear cabinets and creates the control command on the basis of data for a plurality of switchgear cabinets. In this configuration, method steps a) to d) are therefore carried out for a plurality of switchgear cabinets, for instance by means of appropriate sensors or appropriate approximations or assumptions, which makes it possible to determine component temperatures and dew point temperatures for a plurality of switchgear cabinets. These data can then be evaluated by the central control unit. Accordingly, the control command can be created from the multiplicity of data items, as described above.

In this configuration, the peripherals which need to be provided in the switchgear cabinets can be reduced since it is possible to dispense with a control unit or control units. Furthermore, the sensor data may be captured for part of a group of switchgear cabinets, for example, and the control command can be extended to all switchgear cabinets.

In addition, the control command may be based on a multiplicity of data items collected independently of one another, which can make the method particularly reliable.

It may be preferred for the control command to be created taking into account climatic conditions outside the switchgear cabinet. In particular, it is possible to use a temperature and/or solar radiation or a degree of cloud cover that occurs or is present outside the switchgear cabinet. As a result, the method can be carried out in a particularly reliable and efficient manner. In this case, steps a), b) and d), for instance, can be carried out only or additionally taking into account climatic conditions outside the switchgear cabinet.

It may also be preferred for the control command to be created using an artificial intelligence method. For example, the method can be carried out using a neural network. In this configuration, the method can be carried out in a particularly exact and adaptable manner. For example, the dependence on temperature fluctuations of the atmosphere inside the switchgear cabinet with respect to the component temperature can be captured and evaluated. For example, it is possible to predict how the component temperature changes on the basis of temperature fluctuations in order to thus control the anti-condensation heating system in a particularly safe manner. Furthermore, parameters, for instance climatic conditions outside the switchgear cabinet, can be taken into account and can be included in the evaluation in a particularly reliable manner.

With respect to further advantages and technical features of the method, reference is made to the description of the system, the figures and the description of the figures, and vice versa.

The present invention also relates to a system for controlling the temperature of a first switchgear cabinet for medium-voltage and high-voltage switching devices, for example for circuit breakers and/or isolating switches, wherein the first switchgear cabinet has an anti-condensation heating system for preventing condensation of air humidity on components in the internal volume of the first switchgear cabinet, wherein the control arrangement has at least:

a sensor for determining the humidity of the atmosphere in the internal volume of the first switchgear cabinet;

a sensor for determining the temperature of the atmosphere in the internal volume of the first switchgear cabinet;

a sensor for determining the component temperature of at least one component in the internal volume of the first switchgear cabinet; and a control unit, wherein the control unit is configured to determine the dew point temperature of the atmosphere in the internal volume of the first switchgear cabinet on the basis of the humidity and the temperature of the atmosphere in the internal volume of the first switchgear cabinet, and to create a control command, and in particular forward it to the anti-condensation heating system, for controlling the anti-condensation heating system on the basis of a comparison of the temperature of the at least one component in the internal volume of the first switchgear cabinet and the dew point temperature.

Such a system is used, in particular, to carry out a method as described in detail above.

For the reasons mentioned above in particular, a system described here therefore allows condensation on components inside a switchgear cabinet for medium-voltage or high-voltage applications to be prevented or at least significantly reduced in an effective and safe manner. In this case, it is possible to provide a particularly environmentally friendly and sustainable solution which can likewise enable operation which is particularly stable in the long term.

In this case, different sensors for determining the humidity of the atmosphere in the internal volume of the first switchgear cabinet, for determining the temperature of the atmosphere in the internal volume of the first switchgear cabinet and for determining the component temperature of at least one component in the internal volume of the first switchgear cabinet may be respectively provided, or provided sensors may determine a plurality of parameters. The latter is possible, for example, if the parameters are determined, for instance, on the basis of climatic conditions which are present outside the switchgear cabinet and assumptions or approximations described above in detail are made.

Provision may be made for the control unit to be arranged in the switchgear cabinet. This makes it possible to control an anti-condensation heating system of the switchgear cabinet in an autonomous manner, in particular.

In particular, in this configuration, it becomes possible for the control command to be used only to control the anti-condensation heating system of the first switchgear cabinet. It also becomes possible for a control command to be created by a local control unit assigned only to the first switchgear cabinet.

It may also be preferred for the control unit to be arranged separately from the switchgear cabinet and to be able to be connected to the sensors via a wireless connection for data transfer. In this configuration, it becomes possible for the control command to be used to control the anti-condensation heating system of the first switchgear cabinet and additionally to control an anti-condensation heating system of at least one second switchgear cabinet.

In particular, it therefore becomes possible for the component temperature determined for the first switchgear cabinet and the dew point temperature determined for the first switchgear cabinet to be used to create a control command for controlling the anti-condensation heating system of the second switchgear cabinet.

In this configuration, it is preferably possible for a control command to be created by a central control unit which receives data for a plurality of switchgear cabinets and creates the control command on the basis of data for a plurality of switchgear cabinets.

In principle, provision may be made for the control unit to be able to be connected to at least one anti-condensation heating system arranged in a switchgear cabinet for data transfer. In this case, the data connection which can be formed may be effected by means of a cable-based data line or in a wireless manner.

With respect to further advantages and technical features of the system, reference is made to the description of the method, the figures and the description of the figures, and vice versa.

BRIEF DESCRIPTION OF THE FIGURES

Further details, features and advantages of the subject matter of the invention emerge from the subclaims and from the following description of the figures and the associated examples. In the figures:

FIG. 6 shows a graph showing the scope of application of the method according to the invention.

DETAILED DESCRIPTION OF THE INVENTION

Figure 1:
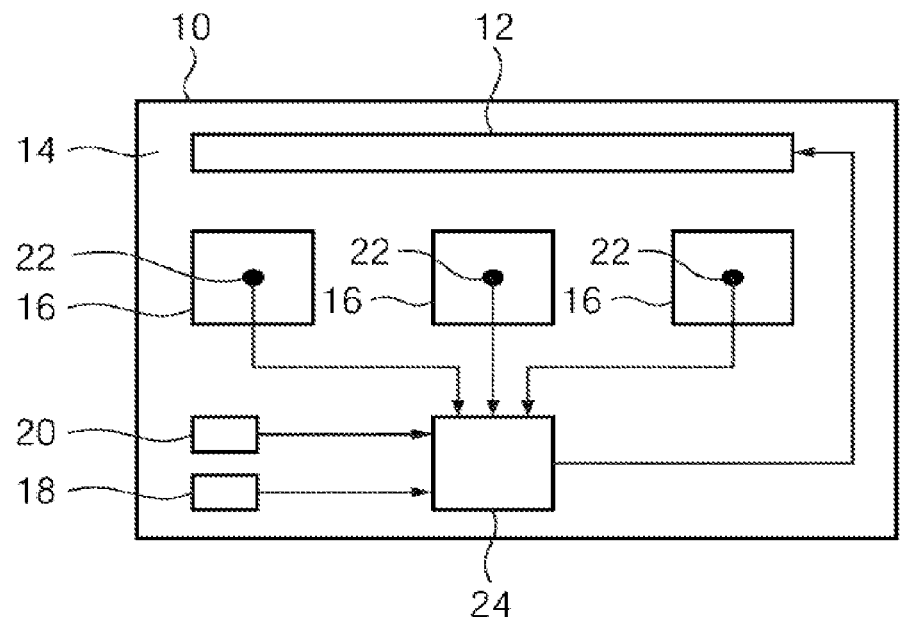
FIG. 1 schematically shows a system for controlling the temperature of a switchgear cabinet in a first configuration.

FIG. 1 shows a configuration of a system for controlling the temperature of a switchgear cabinet 10. In particular, the switchgear cabinet 10 is used to control medium-voltage and high-voltage switching devices.

The switchgear cabinet 10 comprises an anti-condensation heating system 12 for preventing condensation of air humidity on components 16 in the internal volume 14 of the switchgear cabinet 10. Three components 16 are shown in this case purely by way of example in the internal volume 14, that is to say for instance inside a housing, of the switchgear cabinet 10 in FIG. 1. Such components 16 may be susceptible to corrosion, for example, with the result that condensation promoting corrosion should be prevented.

In order to prevent corrosion caused by condensation on the components 16 for example, but without being restricted to this, the system allows the temperature of the switchgear cabinet 10 to be controlled in an advantageous manner, in particular by controlling the anti-condensation heating system 12 in an advantageous manner.

For this purpose, the system comprises a sensor 18 for determining the humidity of the atmosphere in the internal volume 14 of the switchgear cabinet 10. This sensor 18 may be a humidity sensor which is known per se and is expediently arranged in the interior of the switchgear cabinet 10, but without being restricted to this.

The system also comprises a sensor 20 for determining the temperature of the atmosphere in the internal volume 14 of the switchgear cabinet 10. Such a sensor 20 may again be configured in a manner known per se and is expediently likewise arranged in the interior of the switchgear cabinet 10, but without being restricted to this.

The system also comprises a sensor 22 for determining the component temperature of at least one component 16 in the internal volume of the first switchgear cabinet 10. Such a sensor 22 may again be configured in a manner known per se and is expediently likewise arranged in the interior of the switchgear cabinet 10 and more precisely on a component 16, but without being restricted to this.

A control unit 24 is also provided. The control unit 24 is connected to the sensors 18, 20, 22 and also to the anti-condensation heating system 12 by means of data connections and can thus control the anti-condensation heating system 12 on the basis of the received sensor data. The data connections are intended to be illustrated by the arrows. In the configuration according to FIG. 1, provision is made in this case for the control unit 24 to be arranged in the switchgear cabinet 10.

In detail, the above-described system allows a method having the following method steps:
a) determining the humidity of the atmosphere in the internal volume 14 of the switchgear cabinet 10;
b) determining the temperature of the atmosphere in the internal volume 14 of the switchgear cabinet 10;
c) determining the dew point temperature of the atmosphere in the internal volume 14 of the switchgear cabinet 10 on the basis of the humidity and the temperature of the atmosphere in the internal volume 14 of the switchgear cabinet;
d) determining the component temperature of at least one component 16 in the internal volume 14 of the switchgear cabinet 10; and
e) creating and executing a control command for controlling the anti-condensation heating system 12 on the basis of a comparison of the component temperature determined in method step d) and the dew point temperature determined in method step c).

In this specific configuration, this method is therefore based on the fact that the anti-condensation heating system 12 can be controlled effectively in a situation-related manner on the basis of the parameters determined by the sensors 18, 20, 22 and energy-saving heating therefore becomes possible. This may be particularly effective if the output of the anti-condensation heating system 12 is reduced on the basis of the control command if the component temperature determined in method step d) is greater than the dew point temperature determined in method step c).

In this configuration, the sensors in the interior of the switchgear cabinet 10 of a switching device for determining the dew point temperature of the interior air are therefore used in conjunction with sensors for determining the temperature of critical components 16. Electronics, in particular smart electronics, of the control unit 24 compare the variables and decide on the control of the anti-condensation heating system 12 in the switchgear cabinet 10 on the basis of default values. They then provide, for example, a corresponding output signal for controlling a contactor in the switchgear cabinet.

In principle, however, provision may also be made for the parameters comprising the temperature of the atmosphere in the switchgear cabinet 10, the component temperature and the relative air humidity of the atmosphere in the switchgear cabinet 10 to be determined and accordingly approximated by means of sensors outside the switchgear cabinet 10.

The condition for interrupting the anti-condensation heating system 12 may preferably be as follows:

component temperature−safety margin>dew point temperature of the switchgear cabinet interior air.

The safety margin is a value which is to be stipulated by the developer, for example, and is in a range of >0. The heating and cooling behavior (time constant) of the critical component(s) 16 should be taken into account here, in particular.

In order to increase the reliability of the system with respect to condensation, the safety margin can be increased or the measurement on further (n) critical components 16 with expected different temperatures can be introduced. In addition to the reliability, this also optimizes the energy efficiency. The condition for interrupting the anti-condensation heating system with n=2 component sensors is intended to be as follows:

Component temperature 1−safety margin 1>dew point temperature of the switchgear cabinet interior air

AND component temperature 2−safety margin 2>dew point temperature of the switchgear cabinet interior air.

In this first solution approach, which can also be referred to as "on board", the control decision for interrupting the anti-condensation heating system 12 is made for each switching device individually by local sensors and electronics in the respective switchgear cabinet 10.

For example and in principle, intermittent operation of the anti-condensation heating system 12 may be possible. If the conditions for switching off the anti-condensation heating system 12 are not met, the heating system remains in operation. As a result of the heat output which is introduced, the temperature of the atmosphere 14 and of the components 16 is increased and the relative humidity of the interior air is reduced. As a result, the physical/climatic variables are changed such that condensation cannot occur.

Operation of the anti-condensation heating system 12 is maintained for a time to be stipulated (interval operating time). This time can be optimized according to the time of day and season. The active switching-off is then carried out. This is maintained until the conditions for interrupting the anti-condensation heating system 12 are met again.

Switchgear cabinet climate data and component temperatures may also be measured locally for the plurality of switchgear cabinets, for instance for an entire station, representative of only one switching device or one switchgear cabinet 10. The determined data are processed and assessed in the station control technology. The control signal derived therefrom controls, for instance, the anti-condensation heating systems 12 of all switchgear cabinets 10 in the substation.

Figure 2:
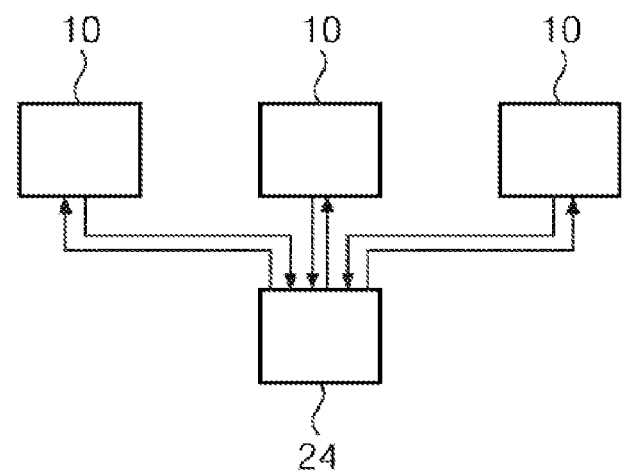
FIG. 2 schematically shows a system for controlling the temperature of a switchgear cabinet in a further configuration.

FIG. 2 shows an alternative configuration of a corresponding system. The configuration according to FIG. 2 shows a plurality of switchgear cabinets 10. More precisely, three switchgear cabinets 10 are shown. The configuration of the switchgear cabinets 10 which is shown in FIG. 1 can also apply to the switchgear cabinets 10 shown in FIG. 2. However, FIG. 2 shows that the control unit 24 is in the form of a central control unit 24.

Therefore, the control unit 24 can receive sensor data for one or more switchgear cabinets 10, for which purpose data connections, in particular wireless data connections, which are again indicated by the arrows are provided. The control unit 24 can carry out the method described above and, on the basis of all sensor data, can create a control command, on the basis of which one or preferably more anti-condensation heating systems 12 of various switchgear cabinets 10 can operate.

Sensors are used here, as described with respect to FIG. 1, but the sensor data for only one representative switchgear cabinet 10 in a substation, for example, can be transmitted to the station control technology, for example wirelessly. The measurement data or sensor data are used here by processing logic, in particular smart processing logic, in a similar manner to the above-described embodiment for controlling the anti-condensation heating systems 12 of the switching devices in the substation. The processing logic for creating the control command may fundamentally be based, for instance, on artificial intelligence and/or may comprise a cloud solution.

Upon reaching the required condition for switching off the anti-condensation heating systems 12, all circuits of the anti-condensation heating systems 12 of the substation are interrupted in the control technology, for example. Appropriate contactors in the control room can be controlled for this purpose.

So that the conditions of various switching devices (circuit breakers, isolating switches) and of possible different manufacturers can also be adequately taken into account in a substation, the condition for interrupting the anti-condensation heating system 12 of all devices may be as follows:

> Component temperature–safety margin 1 (switching device type)–safety margin 2 (switching device manufacturer)>dew point temperature of the switchgear cabinet interior air.

The safety margins are fundamentally temperature values or temperature ranges (>0) to be stipulated or factors for the component temperature. The switching-device-specific and switching-device-manufacturer-specific heating and cooling behavior of the respective critical components 16 should be taken into account here, in particular.

In the case of a centralized control unit 24, it also becomes possible, for example, to use exemplary sensor data for the switchgear cabinet 10 of a switching device in a substation and to process said data inside the station in a smart manner in order to derive control signals therefrom which are used for the entire installation or a large number of switchgear cabinets 10. Sensor data for a number x of switchgear cabinets 10 can therefore be used to control the anti-condensation heating systems 12 of a number y of switchgear cabinets 10, wherein the number x is less than the number y.

The method of operation and the advantages of the system described above and of the method described above are explained in the following figures.

Figure 3:
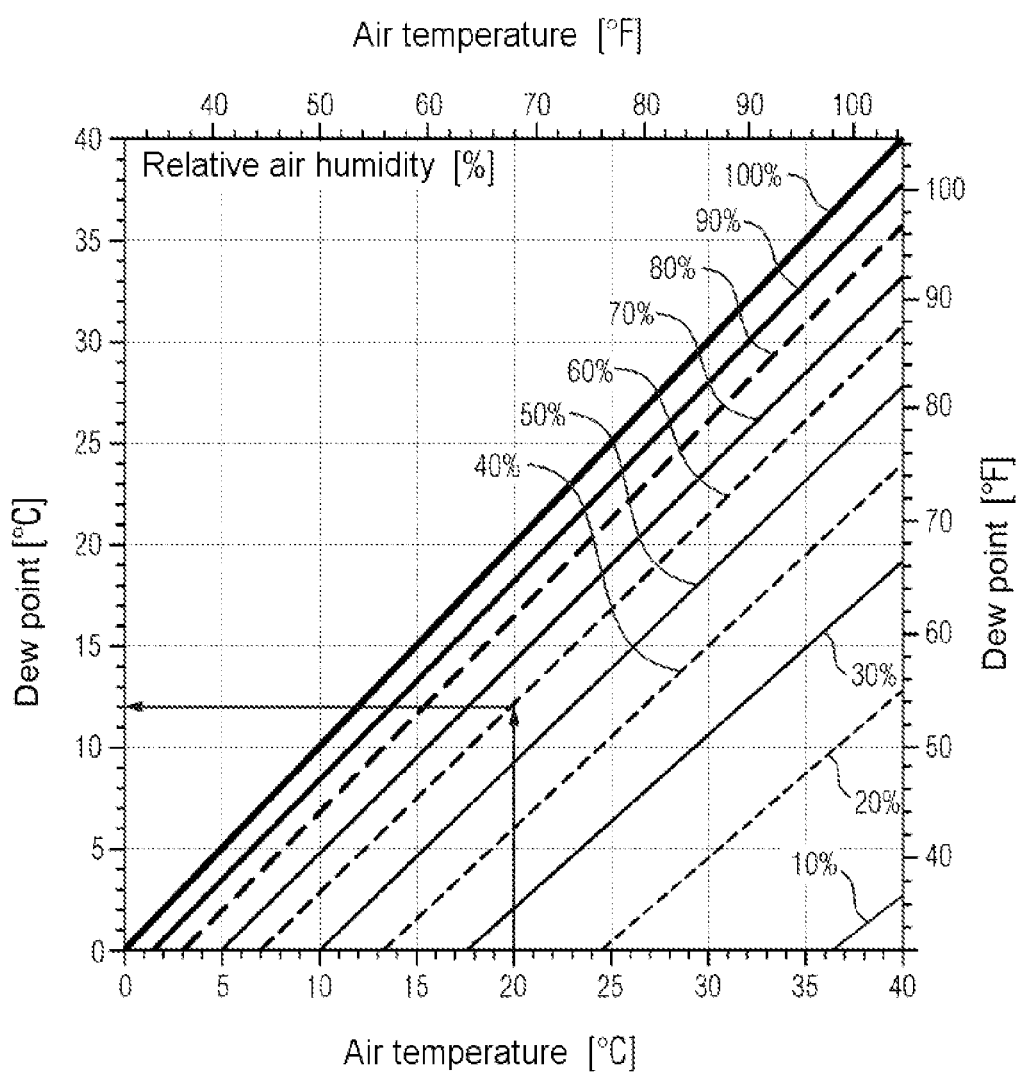
FIG. 3 shows a graph illustrating the relationship between the dew point and the air humidity and the air temperature.

FIG. 3 shows a graph showing the relationship between the dew point and the air humidity and the air temperature. In detail, the X axes show the air temperature and the Y axes show the dew point or the dew point temperature, whereas various lines show the relative air humidity. The dew point can be easily determined from this relationship in given climatic conditions. This is shown, for instance, for an air temperature of 20° C. and an exemplary relative air humidity of 60%. If the air temperature and the air humidity are combined, a dew point of approximately 12° C. is obtained. These physical relationships are used in the method of the invention.

Figure 4:
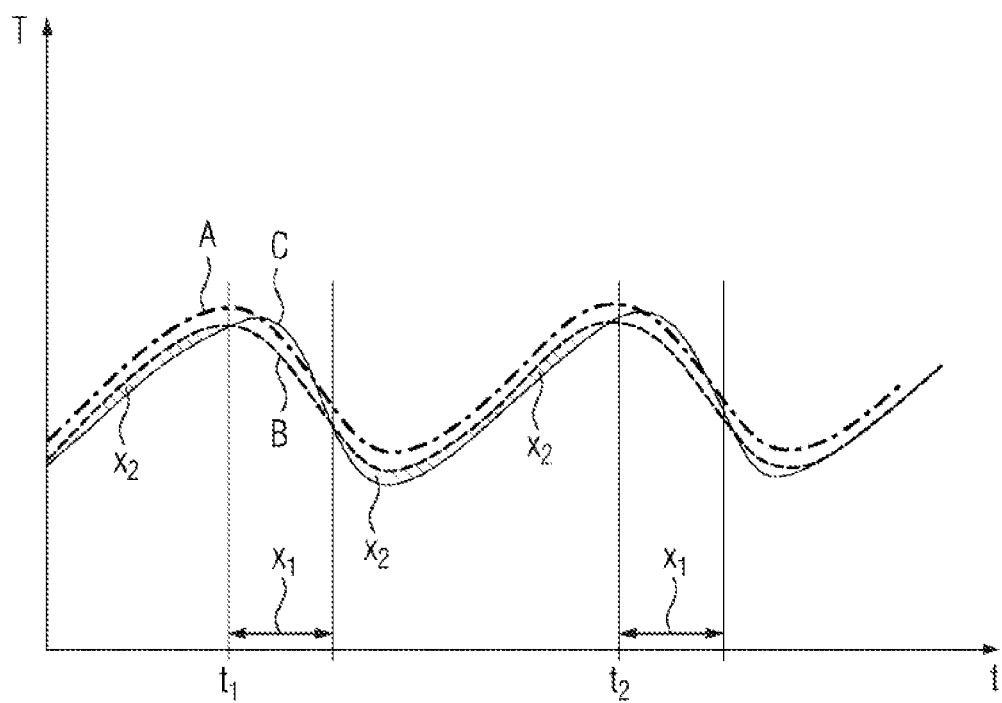
FIG. 4 shows a graph illustrating the relationship between present climatic conditions and the component temperature.

FIG. 4 also shows a possible simulative consideration of external climatic conditions. In the method according to the invention, external climatic conditions, for instance the solar radiation or the external temperature, can fundamentally be advantageously used to make it possible to effectively control the anti-condensation heating system 12.

In the graph in FIG. 4, the x axis represents the time and the y axis represents the temperature. In this case, curve A shows the ambient temperature, curve B shows the dew point temperature and curve C shows the component temperature. In this case, an exemplary profile of the component temperature, in connection with the profiles of the ambient and dew point temperatures of the air, is illustrated against time. If the component temperature is below the dew point temperature of the ambient air, condensation forms. At times at which condensation forms, which are indicated using hatching and with x2, the switchgear cabinet heating system or the anti-condensation heating system 12 should be operating.

At the other times, which start at t1 and t2, which can respectively correspond to midday, and are referred to as x1, the operation of the anti-condensation heating system 12 can be dispensed with since the component temperature is above the dew point temperature.

It can therefore be seen that, on account of the thermal inertia of the components 16, which is dependent on their mass (m) and their specific thermal capacity (c), the temperature is always adjusted with a time delay, however. The component temperature is therefore usually after the ambient temperature with a time delay. In addition, small components 16 lose their heat more quickly than the surrounding air as a result of emission in the evening.

With respect to the consideration of the temperature, additional solar radiation, as described above, can be readily used to control the anti-condensation heating system 12. Since the solar radiation counteracts the formation of condensation, this is a supportive case which makes it possible to reduce the heat output. In principle, the solar radiation can therefore be considered in addition to the ambient temperature, but the solar radiation can possibly also remain out of consideration on account of the supportive effect.

However, as shown above, the ambient temperature may be important, in particular, since the component temperature is a function of the ambient temperature and may asymptotically become like the latter after a particular time and the temperature of the atmosphere in the interior of the switchgear cabinet 10 will also become like the temperature of the atmosphere surrounding the switchgear cabinet 10.

Figure 5:
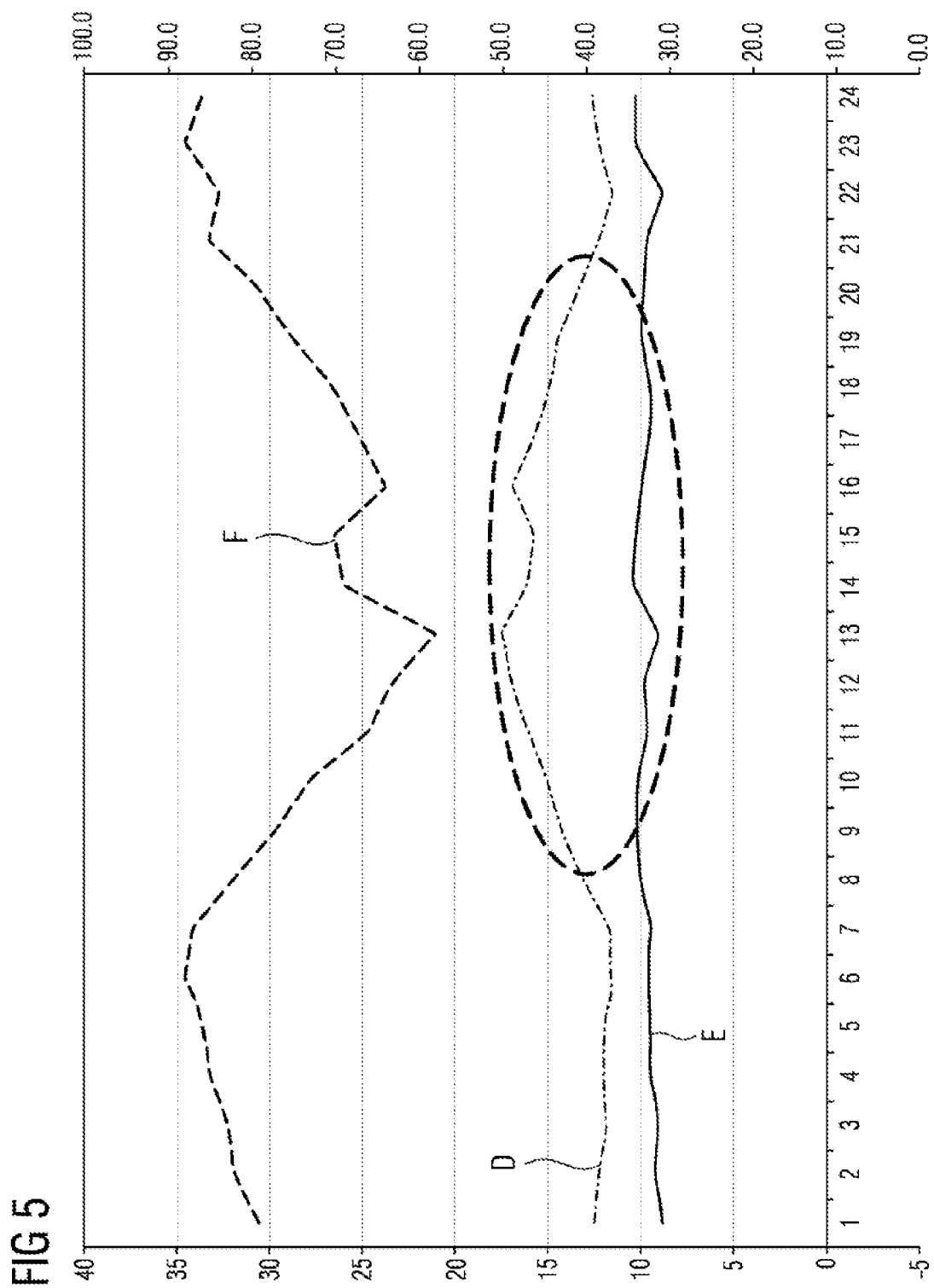
FIG. 5 shows a graph illustrating a possible use of the method according to the invention along the time axis of one day.

FIG. 5 also shows a graph in which an actual daily profile of climate variables is shown, by way of example, on the basis of real data. In detail, FIG. 5 shows the temperature on the left-hand Y axis and the relative air humidity on the right-hand Y axis, whereas the X axis indicates a daily profile in hours. Curve D also shows the temperature which may be, in particular, an outside temperature with respect to a switchgear cabinet 10, and curve F shows the relative air humidity and curve E shows the dew point temperature based on the previous parameters. In detail, the profiles of relative humidity, outside temperature and derived dew point temperature are therefore shown over an entire day.

In the region which is marked as an oval and in which the outside temperature and the dew point temperature differ considerably, there is potential to interrupt the continuous heating operation of the anti-condensation heating system 12 and therefore to save energy and $CO_2$, for example.

FIG. 6 also shows a graph which shows, by way of example on the basis of real values, the frequency of the hours in a months in %, in each case for a selected temperature delta, for instance 5 K, between the air temperature, which may be considered to be a rough indication of the component temperature as described above, and the dew point temperature. In this case, the air temperature and the component temperature as well as the air humidity were approximated by means of measurements of the temperature and the air humidity outside the switchgear cabinet 10, which is possible on account of the non-airtight configuration of the switchgear cabinets 10.

The temperature deltas between the ambient temperature and the dew point temperature were graphically illustrated for each month individually and then also as an arithmetic mean or average for all months. With the mean curve, or with the curve referred to as average, showing the arithmetic mean, it is easily possible to make an approximate but realistic estimation for the frequency of the hours in a year in which there is a certain sufficient temperature difference between the ambient temperature, that is to say approximated to the component temperature, and the dew point temperature to temporarily switch off the anti-condensation heating system 12, for example.

The decision logic is based, for example, on the relationship between the ambient temperature and the component temperature which continuously approaches the latter, with the result that a sufficiently large difference between the component temperature and the dew point temperature can also be inferred given a sufficiently great difference between the ambient temperature and the dew point temperature.

Starting from a first provisionally assumed minimum temperature delta of 5 K between the ambient temperature and the dew point temperature, a saving potential of around 30% can be determined over the entire year, cf. FIG. 5, assumption: temperature delta 5 K.

The invention claimed is:

1. A method of controlling a temperature of a switchgear cabinet for medium-voltage or high-voltage switching devices, the method comprising the following method steps:
providing the switchgear cabinet for medium-voltage or high-voltage switching devices with an anti-condensation heating system for preventing a condensation of air humidity on components in an internal volume of the switchgear cabinet;
a) determining a humidity of an atmosphere in an internal volume of the switchgear cabinet;
b) determining a temperature of the atmosphere in the internal volume of the switchgear cabinet;
c) determining a dew point temperature of the atmosphere in the internal volume of the switchgear cabinet based on the humidity and the temperature of the atmosphere in the internal volume of the switchgear cabinet;
d) determining a component temperature of at least one of the components in the internal volume of the switchgear cabinet; and
e) generating a control command for controlling the anti-condensation heating system based on a comparison of the component temperature determined in step d) and the dew point temperature determined in step c);
f) decreasing a power of the anti-condensation heating system based on the control command when the component temperature determined in step d) is greater than the dew point temperature determined in step c).

2. The method according to claim 1, which comprises taking a safety parameter into account when comparing the component temperature determined in step d) with the dew point temperature determined in step c), and wherein the safety parameter is based on the component whose component temperature has been determined.

3. The method according to claim 1, wherein step d) comprises determining the component temperature of at least two components in the internal volume of the switchgear cabinet, and step e) comprises generating the control command based on a comparison of all determined component temperatures and the dew point temperature.

4. The method according to claim 1, wherein the switchgear cabinet is a first switchgear cabinet and the method comprises using the control command to control only the anti-condensation heating system of the first switchgear cabinet.

5. The method according to claim 4, wherein the switchgear cabinet is a first switchgear cabinet and the method comprises generating a control command by a local control unit assigned only to the first switchgear cabinet.

6. The method according to claim 1, wherein the switchgear cabinet is a first switchgear cabinet of a plurality of switchgear cabinets, and the method comprises using the control command to control the anti-condensation heating system of the first switchgear cabinet and to control an anti-condensation heating system of at least one second switchgear cabinet.

7. The method according to claim 6, which comprises using the component temperature determined for the first switchgear cabinet and the dew point temperature determined for the first switchgear cabinet to create a control command for controlling the anti-condensation heating system of the at least one second switchgear cabinet.

8. The method according to claim 1, which comprises creating the control command by a central control unit which receives data for a plurality of switchgear cabinets and creates the control command on a basis of data for a plurality of switchgear cabinets.

9. The method according to claim 1, which comprises performing at least one of steps a), b), and d) with sensors disposed in the internal volume of the switchgear cabinet.

10. The method according to claim 1, which comprises generating the control command taking into account climatic conditions outside the switchgear cabinet.

11. A system for controlling a temperature in a switchgear cabinet for medium-voltage and high-voltage switching devices, the switchgear cabinet having an anti-condensation heating system for preventing a condensation of air humidity on components in an internal volume of the switchgear cabinet, the system comprising:
a sensor for determining a humidity of an atmosphere in the internal volume of the switchgear cabinet;
a sensor for determining a temperature of the atmosphere in the internal volume of the switchgear cabinet;
a sensor for determining a component temperature of at least one component in the internal volume of the switchgear cabinet; and
a control unit configured to determine a dew point temperature of the atmosphere in the internal volume of the switchgear cabinet based on the humidity and the temperature of the atmosphere in the internal volume of the switchgear cabinet, and configured to create a control command for controlling the anti-condensation heating system based on a comparison of the temperature of the at least one component in the internal volume of the switchgear cabinet and the dew point temperature; and configured to decrease a power of the anti-condensation heating system based on the control command when the temperature of the at least one component in the internal volume of the switchgear cabinet is greater than the dew point temperature.

12. The system according to claim 11, wherein said control unit is arranged in the switchgear cabinet.

13. The system according to claim 11, wherein the switchgear cabinet is one of a plurality of switchgear cabinets and said control unit is arranged in one of the switchgear cabinets.

14. The system according to claim 11, wherein said control unit is arranged separately from the switchgear cabinet and is configured for connecting to said sensor for determining the humidity, to said sensor for determining the temperature in the switchgear cabinet, and to said sensor for determining the component temperature via a wireless connection for data transfer.

* * * * *